United States Patent [19]
Takahashi et al.

[11] Patent Number: 5,711,587
[45] Date of Patent: Jan. 27, 1998

[54] COVER MOUNTING STRUCTURE FOR SHELF ASSEMBLY

[75] Inventors: Tetsuya Takahashi; Hisao Hayashi; Shigeru Amagasa; Takashi Sato; Hiroshi Yamaji; Tsutomu Takahashi; Tomoyuki Hongoh, all of Kanagawa; Koichi Namimatsu, Fukuoka, all of Japan

[73] Assignee: Fujitsu Limited, Kawasaki, Japan

[21] Appl. No.: 568,383

[22] Filed: Dec. 6, 1995

[30] Foreign Application Priority Data

Mar. 20, 1995 [JP] Japan ............... 7-060703

[51] Int. Cl.⁶ .................................. A47B 47/00
[52] U.S. Cl. ............. 312/265.6; 312/223.6; 312/328; 312/319.2; 361/641
[58] Field of Search ............. 312/263, 265.5, 312/265.6, 223.1, 223.6, 257.1, 327, 328, 319.2; 220/334, 333, 4.02; 361/641, 657, 724; 174/50, 66

[56] References Cited

U.S. PATENT DOCUMENTS

| | | | |
|---|---|---|---|
| 2,192,862 | 3/1940 | Eagley | 312/265.6 X |
| 2,702,116 | 2/1955 | Shnitzler et al. | 220/334 X |
| 2,849,270 | 8/1958 | Warnock | 312/328 |
| 3,140,344 | 7/1964 | Slater et al. | 361/657 X |
| 3,341,268 | 9/1967 | Bickford | 312/223.1 X |
| 3,895,179 | 7/1975 | Wyatt | 361/657 X |
| 4,289,362 | 9/1981 | Kramer | 312/257.1 X |
| 4,791,244 | 12/1988 | Taybl | 312/328 X |
| 5,016,947 | 5/1991 | Hsu et al. | 312/223.6 X |
| 5,621,387 | 4/1997 | Phillips et al. | 220/4.02 X |

FOREIGN PATENT DOCUMENTS

| | | |
|---|---|---|
| 2-144994 | 6/1990 | Japan . |
| 3-270096 | 12/1991 | Japan . |
| 5-335772 | 12/1993 | Japan . |
| 416786 | 1/1967 | Switzerland ............ 174/50 |

*Primary Examiner*—Peter M. Cuomo
*Assistant Examiner*—Janet M. Wilkens
*Attorney, Agent, or Firm*—Staas & Halsey

[57] ABSTRACT

A cover mounting structure for a shelf assembly which allows easy mounting of a cover to a shelf and can reliably prevent falling of the cover even when the cover is unlocked. The shelf assembly includes a shelf having a pair of side plates and a plurality of electronic circuit packages mounted in the shelf. The cover mounting structure includes a cover having a front plate, a pair of side plates bent from the front plate at a substantially right angle thereto, and a top plate bent from the front plate at a predetermined angle thereto; and a pair of shafts fixed in the vicinity of the upper ends of the side plates of the cover so as to project inside of the cover. A pair of recesses for receiving the shafts are formed at the upper ends of the side plates of the shelf, and a pair of guiding slant surfaces for guiding reception of the shafts into the recesses are formed at the front edges of the upper ends of the side plates of the shelf. The shafts are engaged with the recesses to thereby mount the cover on the shelf assembly.

9 Claims, 14 Drawing Sheets

FIG. 16
PRIOR ART
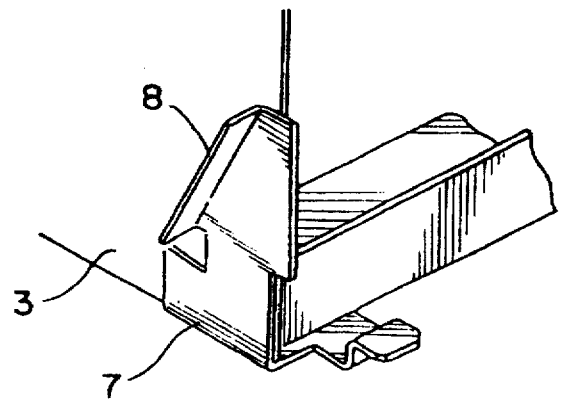
FIG. 17A
PRIOR ART
FIG. 17B
PRIOR ART
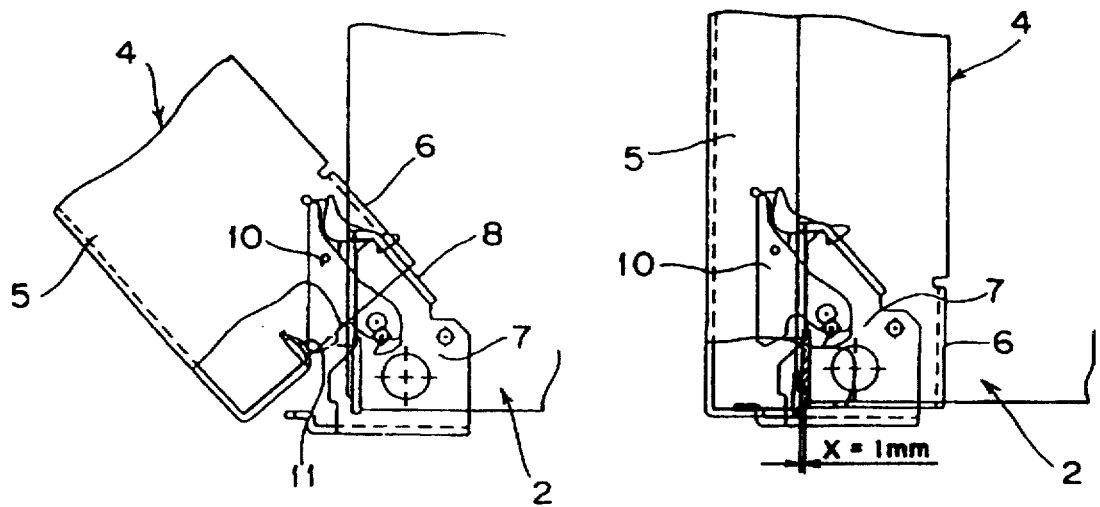

COVER MOUNTING STRUCTURE FOR SHELF ASSEMBLY

BACKGROUND OF THE INVENTION

1. Field of the Invention

The present invention relates to a cover mounting structure for a shelf assembly.

2. Description of the Related Art

A shelf assembly is constructed by mounting a plurality of electronic circuit packages in a boxlike shelf. Each electronic circuit package is constructed by mounting a plurality of electronic components such as LSIs forming electronic circuits on a printed wiring board. For example, electronic circuits in an electrical PBX are all of a package type, which is intended to simplify and economize the designing of a communication device and also to improve the convenience in maintenance. Almost every communication device is constructed of a shelf assembly including a shelf and a plurality of electronic circuit packages mounted in the shelf.

In such a shelf assembly, a cover (surface plate) for entirely covering the shelf is detachably mounted on the shelf to electromagnetically shield the interior of the shelf for the purposes of protection of the packages stored in the shelf and prevention of electromagnetic interference of the packages. Every time the maintenance, inspection, etc. of the electronic circuit packages stored in the shelf are carried out, the cover must be removed from the shelf. Therefore, it is desired that the cover can be removed from the shelf by a safe and simple method.

A cover mounting structure in the related art will now be described with reference to FIGS. 15 to 17B. Reference numeral 2 denotes a boxlike shelf having a pair of side plates 3. As shown in FIG. 16, a support member 7 having a slant surface 8 is fixed to each side plate 3 at its lower front end. Reference numeral 4 denotes a cover having a pair of side plates 5. A guide 6 is formed at the lower end of each side plate 5 so as to be bent from each side plate 5 at a substantially right angle thereto.

In mounting the cover 4 to the shelf 2, the guides 6 of the cover 4 are slid on the slant surfaces 8 of the support members 7 as the cover 4 is being moved obliquely downward. Then, the cover 4 is pivoted about the support members 7 toward the shelf 2, and is next fixed to the front side of the shelf 2 by operating a pair of lock mechanisms 9 provided on the side plates 5 of the cover 4. In removing the cover 4 from the shelf 2, the lock mechanisms 9 are first released, and the cover 4 is next pivoted at a given angle about the support members 7. At this time, the guides 6 formed at the lower ends of the side plates 5 of the cover 4 are retained by the slant surfaces 8 of the support members 7, thereby preventing the cover 4 from falling. Thereafter, the cover 4 is moved obliquely upward along the slant surfaces 8 of the support members 7, thus removing the cover 4.

In the cover mounting structure mentioned above, the guides 6 of the cover 4 are retained by the slant surfaces 8 of the support members 7 as means for preventing falling of the cover 4. Accordingly, in mounting the cover 4, the cover 4 must be moved obliquely downward at such an inclined angle as to accord with the angle of inclination of the slant surfaces 8 in such a manner that the guides 6 of the cover 4 slide on the upper side of the slant surfaces 8. As shown in FIG. 17A, a shield spring 11 is mounted on the peripheral portion of the cover 4. However, in the conventional mounting structure, to prevent deformation of the shield spring 11 due to contact of the shield spring 11 and a package inserting/removing lever 10 in moving the cover 4 along the slant surfaces 8 of the support members 7, the shield spring 11 is limited to have a low degree of flexibility x as an amount of about 1 mm as shown in FIG. 17B.

The use of the shield spring 11 having a low degree of flexibility causes a problem such that when warpage occurs in the cover 4, uniform contact of the shield spring 11 and the shelf 2 cannot be made, so that the electromagnetic shielding function of the shield spring 11 cannot be effectively realized. To avoid this problem, a reinforcing metal fitting is conventionally used to prevent the warpage of the cover 4, causing an increase in weight of the cover 4 and an increase in cost. Further, in the case where the shelf 2 is mounted on the upper side of a rack, the cover mounting and removing work becomes difficult. The cover 4 unlocked falls because of its own weight until it is supported by the support members 7, so that the larger the cover 4 in size, the more dangerous to an operator.

SUMMARY OF THE INVENTION

It is therefore an object of the present invention to provide a cover mounting structure for a shelf assembly which allows easy mounting of a cover to a shelf and can reliably prevent falling of the cover even when the cover is unlocked.

In accordance with an aspect of the present invention, there is provided a cover mounting structure for a shelf assembly including a shelf having a pair of side plates and a plurality of electronic circuit packages mounted in the shelf, the cover mounting structure comprising a cover having a front plate, a pair of side plates bent from the front plate at a substantially right angle thereto, and a top plate bent from the front plate at a predetermined angle thereto; a pair of shafts fixed in the vicinity of upper ends of the side plates of the cover so as to project inside of the cover; a pair of recesses formed at upper ends of the side plates of the shelf, for receiving the shafts; and a pair of guiding slant surfaces formed at front edges of the upper ends of the side plates of the shelf, for guiding reception of the shafts into the recesses; wherein the shafts are engaged with the recesses to thereby mount the cover on the shelf assembly.

Preferably, the top plate of the cover is bent from the front plate at an obtuse angle thereto. Each shaft has a pair of heads between which an annular groove is defined, and the annular groove has a width enough larger than the thickness of each of the side plates of the shelf. Preferably, a shield spring having a high degree of flexibility is mounted on the inside surface of the cover over the entire periphery thereof.

According to the cover mounting structure of the present invention, the cover is retained to the shelf by engaging the shafts fixed to the cover into the recesses formed at the upper ends of the side plates of the shelf. Accordingly, even in the unlocked condition of the cover, the cover can be prevented from falling, thus allowing easy working even at high elevations. In mounting or removing the cover, the shafts are engaged with the recesses of the side plates of the shelf in the condition where the cover is inclined by pivotally moving the lower end of the cover toward an operator, so that there is no possibility that the shield spring may be deformed by contact with package inserting/removing levers. Accordingly, the shield spring having a high degree of flexibility can be used, thereby realizing a reduction in weight and cost of the cover.

The above and other objects, features and advantages of the present invention and the manner of realizing them will become more apparent, and the invention itself will best be understood from a study of the following description and appended claims with reference to the attached drawings showing some preferred embodiments of the invention.

BRIEF DESCRIPTION OF THE DRAWINGS

FIG. 16 is a fragmentary enlarged perspective view of a support member of the cover mounting structure shown in FIG. 15; and FIGS. 17A and 17B are side views illustrating the problem in the cover mounting structure shown in FIG. 15.

DETAILED DESCRIPTION OF THE PREFERRED EMBODIMENTS

Some preferred embodiments of the present invention will now be described in detail with reference to the attached drawings.

Figure 1:
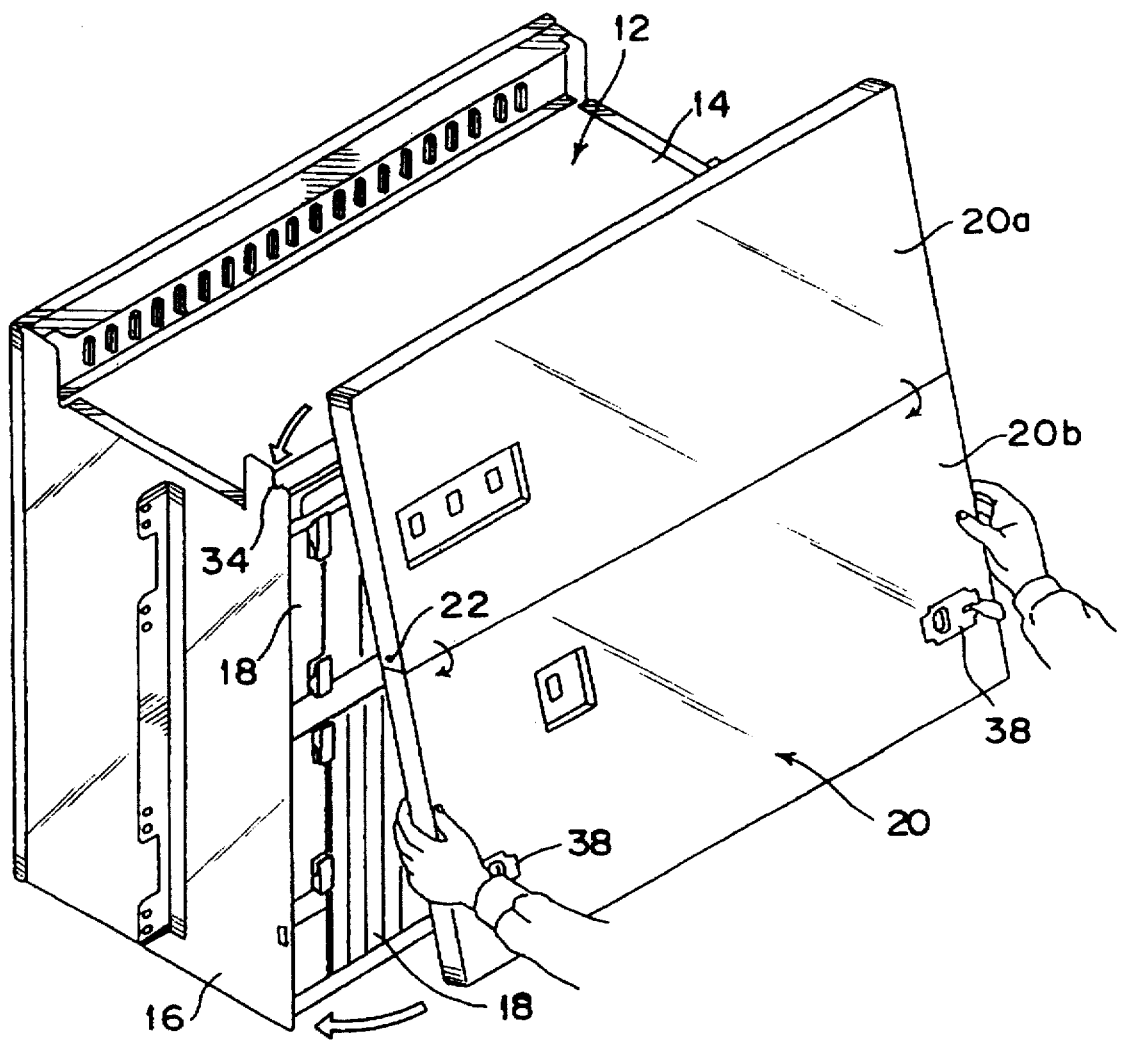
FIG. 1 is a perspective view of a first preferred embodiment of the present invention.
Figure 3:
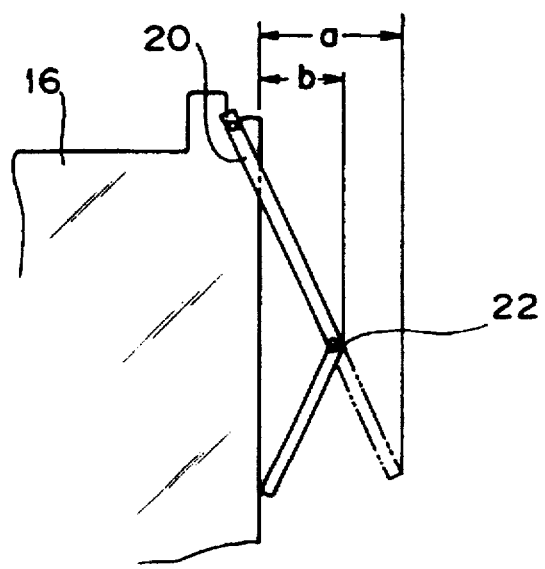
FIG. 3 is a side view illustrating a bent condition of a cover in the first preferred embodiment.

Referring to FIG. 1, there is shown a perspective view of a first preferred embodiment of the present invention. Reference numeral 12 denotes a shelf assembly such as a communication device constructed by inserting and mounting a plurality of electronic circuit packages 18 in a shelf 14. The shelf 14 has a pair of side plates 16. Reference numeral 20 denotes a cover or surface plate divided into two segments 20a and 20b along a horizontal division line. As shown in FIG. 3, the segments 20a and 20b are connected by a pair of connection pins 22 so as to be bendable inwardly.

Figure 2:
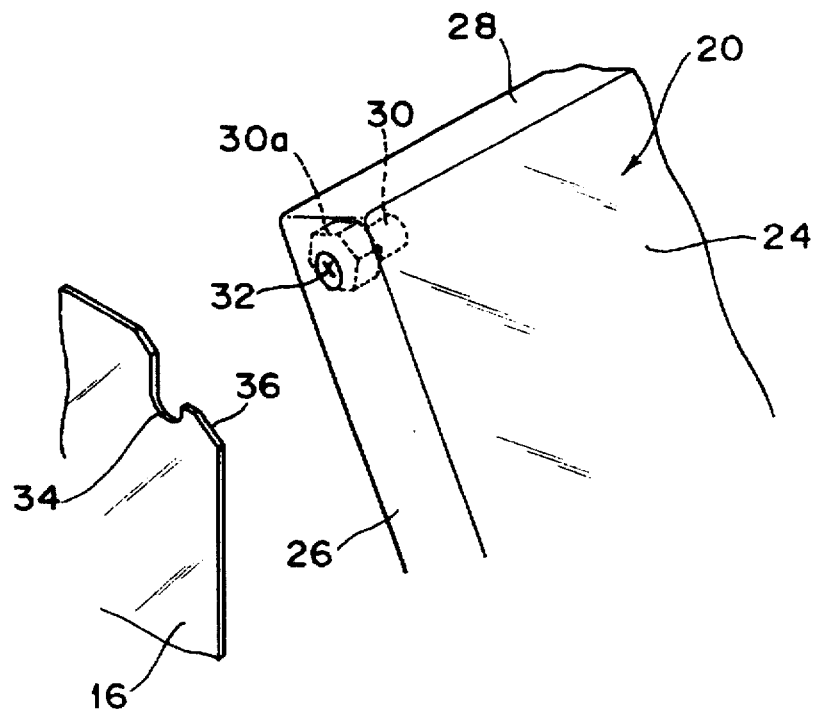
FIG. 2 is a fragmentary perspective view of a cover mounting porting in the first preferred embodiment.

As shown in FIG. 2, the cover 20 has a front plate 24, a pair of side plates 26 bent from the front plate 24 at a substantially right angle thereto, and a top plate 28 bent from the front plate 24 at a substantially right angle thereto. A pair of shafts 30 are fixed by screws 32 in the vicinity of the upper ends of the side plates 26 of the cover 20 so as to project inside of the cover 20. Each shaft 30 has a head 30a. A pair of recesses 34 for receiving the shafts 30 are formed at the upper ends of the side plates 16 of the shelf 14, and a pair of guiding slant surfaces 36 for guiding reception of the shafts 30 into the recesses 34 are formed at the front edges of the upper ends of the side plates 16.

In mounting the cover 20 to the shelf 14, the shafts 30 are first received into the recesses 34 of the side plates 16, and the cover 20 is then pivoted about the axes of the shafts 30 to move the lower end of the cover 20 toward the shelf 14. Thereafter, the cover 20 is locked to the side plates 16 of the shelf 14 by means of a pair of lock mechanisms 38, thereby mounting the cover 20 to the shelf 14. In removing the cover 20 from the shelf 14, the lock mechanisms 38 are first released, and the cover 20 is then pivoted about the axes of the shafts 30 to move the lower end of the cover 20 away from the shelf 14. Thereafter, the cover 20 is lifted with operator's hands, thereby removing the cover 20 from the shelf 14.

Figure 4A:
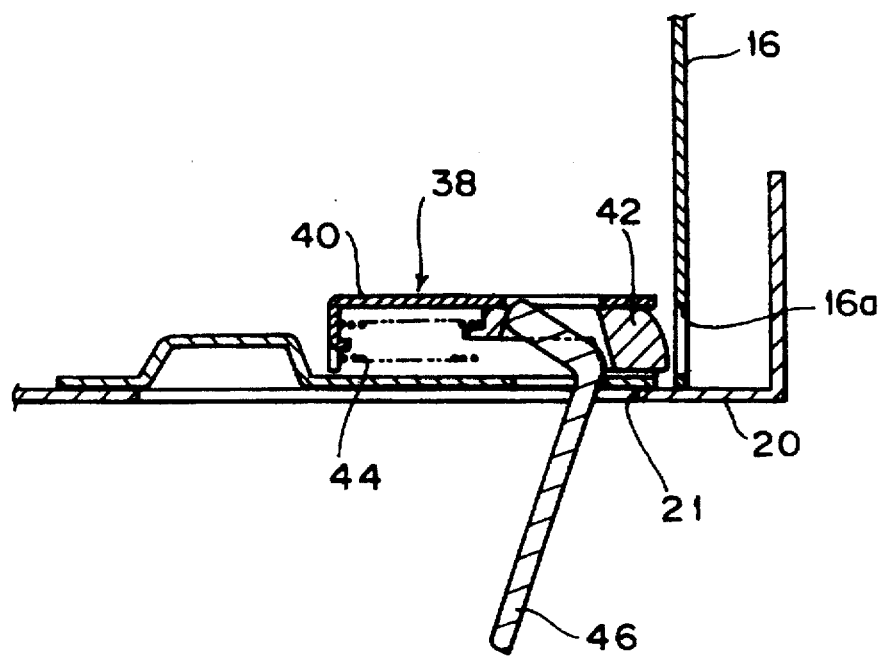
FIG. 4A is a sectional view of a lock mechanism in a release condition thereof.

The structure of each lock mechanism 38 will now be described with reference to FIGS. 4A and 4B. A guide member 40 for guiding a sliding motion of a lock member 42 is mounted on the cover 20. A coil spring 44 is stored in the guide member 40 to bias the lock member 42 rightward as viewed in FIGS. 4A and 4B. A lever 46 for operating the lock member 42 is inserted through an opening 21 of the cover 20 into the guide member 40. When the lever 46 is raised as shown in FIG. 4A, the lock member 42 is moved by the lever 46 leftward as viewed in FIG. 4A against the biasing force of the coil spring 44. At this time, the lock member 42 is disengaged from a lock hole 16a formed through each side plate 16, thereby unlocking the cover 20 from the shelf 14.

Figure 4B:
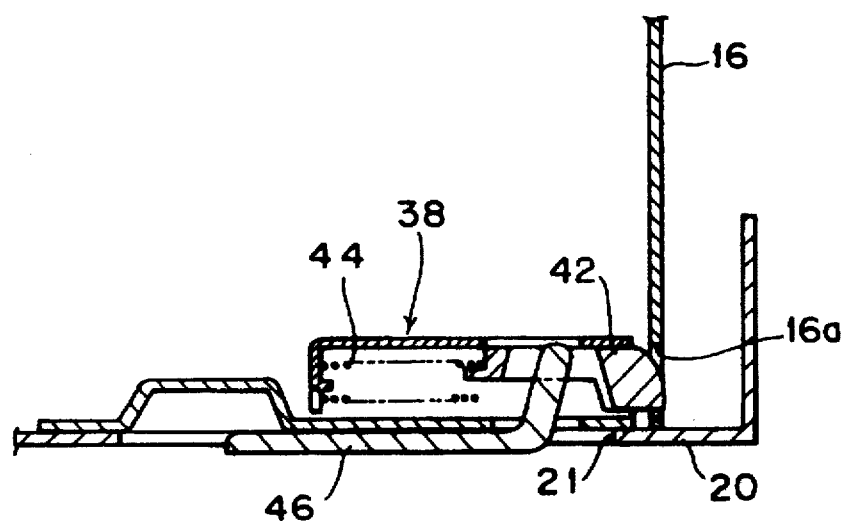
FIG. 4B is a view similar to FIG. 4A, illustrating a locking condition of the lock mechanism.

When the lever 46 is lowered as shown in FIG. 4B, the lock member 42 is moved by the biasing force of the coil spring 44 rightward as viewed in FIG. 4B, and is inserted into the lock hole 16a, thereby locking the cover 20 to the shelf 14. In the case where the cover 20 is large in size, it is preferably divided into the two segments 20a and 20b as mentioned above, whereby when the cover 20 is pivoted at a given angle, the amount of frontward projection, b, of the cover 20 can be made smaller than the amount of frontward projection, a, of an integral cover as shown in FIG. 3.

Figure 5:
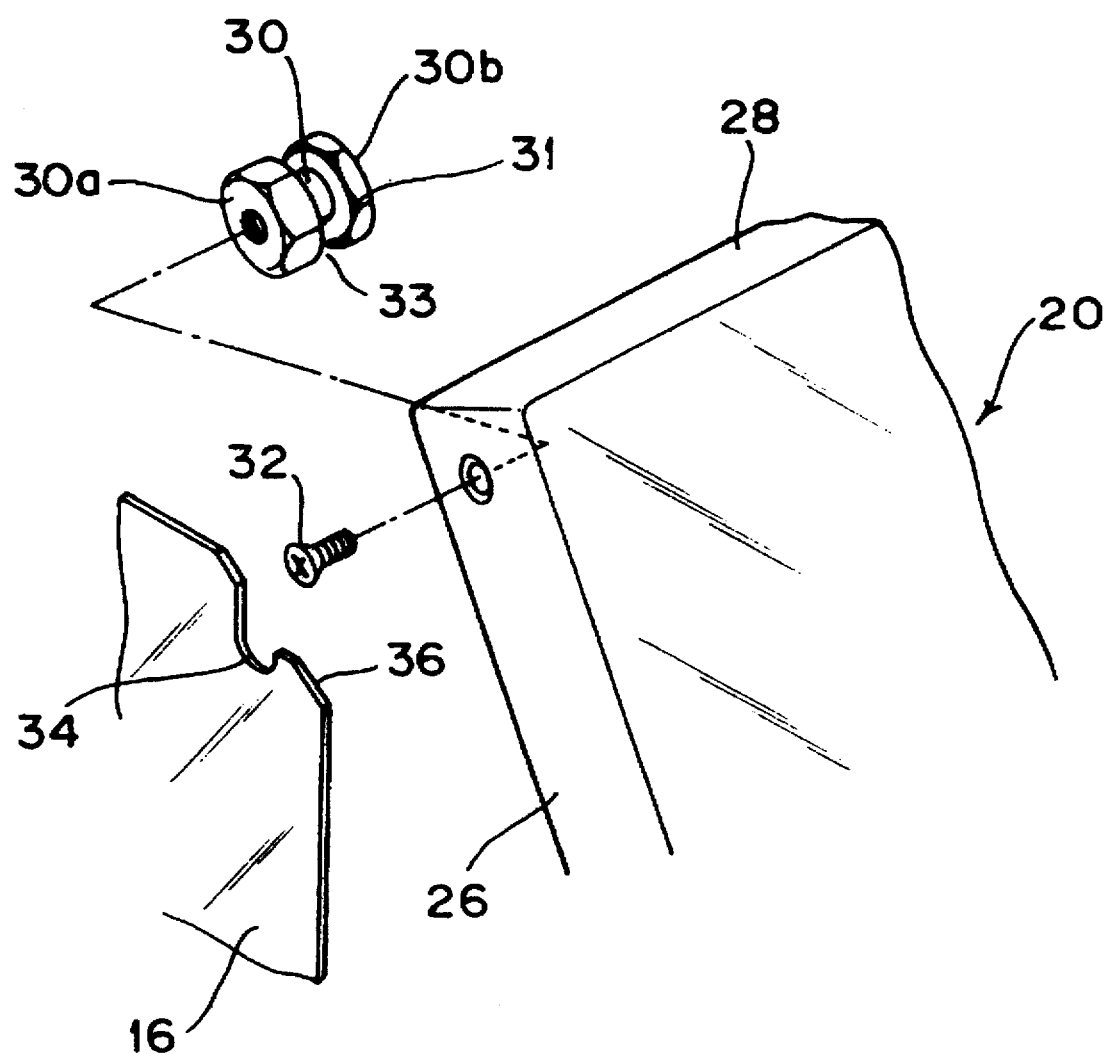
FIG. 5 is a fragmentary exploded perspective view showing a second preferred embodiment of the present invention.

FIG. 5 shows an exploded perspective view of a cover mounting portion according to a second preferred embodiment of the present invention. In this preferred embodiment, each shaft 30 is integrally formed at its both ends with a pair of heads 30a and 30b. An annular groove 33 having a width enough larger than the thickness of each side plate 16 is defined between the two heads 30a and 30b. For example, when the thickness of each side plate 16 is 14 mm, the width of the annular groove 33 is set to about 20 mm.

With this structure, side slip of the cover 20 mounted on the shelf 14 can be prevented. Furthermore, the diameter of each shaft 30 is set slightly smaller than the diameter of each recess 34, thereby preventing frontward or rearward slip of the cover 20 mounted on the shelf 14. The opposed inside walls of the heads 30a and 30b are partially formed with slant surfaces 31 for facilitating hanging of the cover 20 on each side plate 16. To further facilitate the hanging of the cover 20, it is effective to differ the angle of inclination of the slant surface 31 of the head 30a from that of the slant surface 31 of the head 30b.

Figure 6:
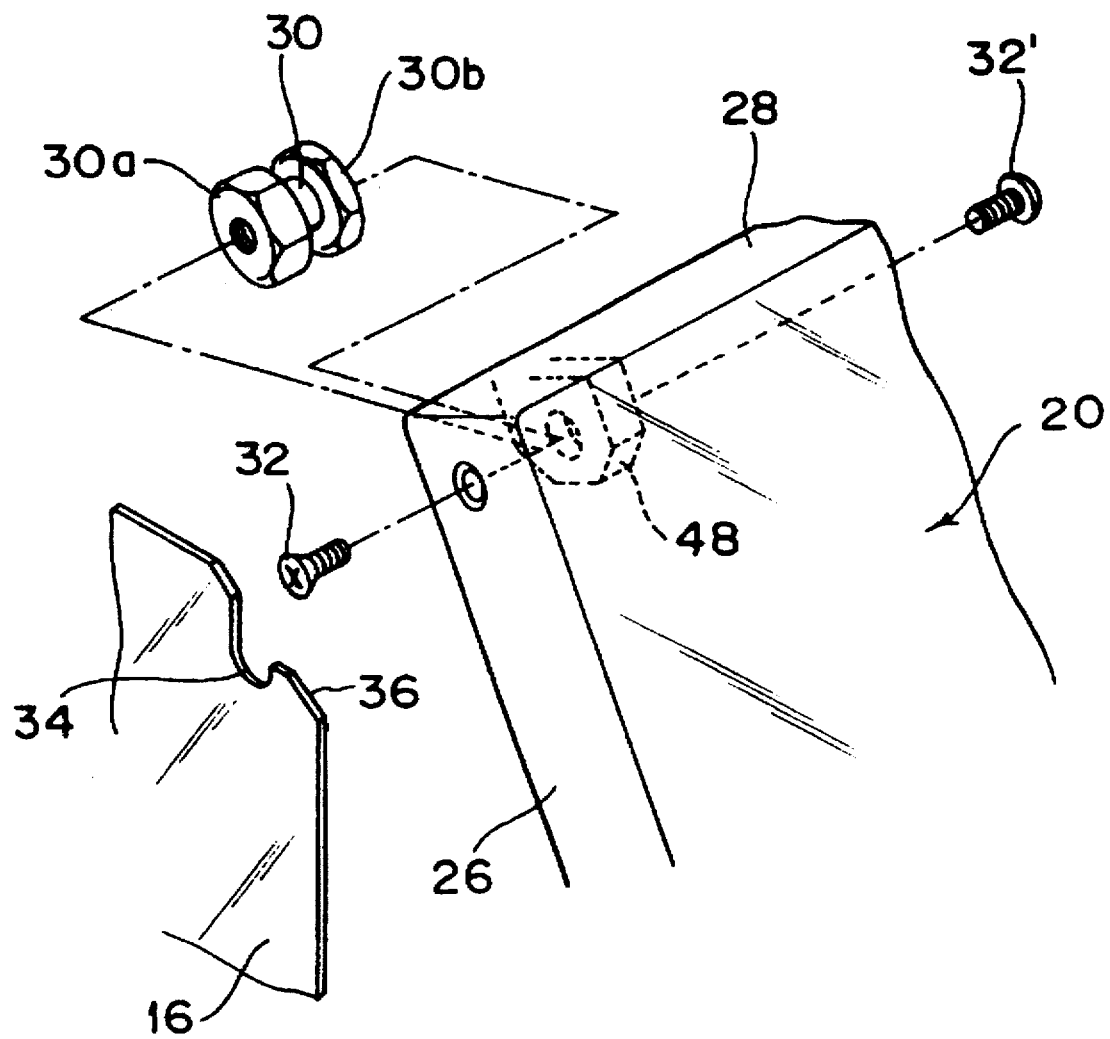
FIG. 6 is a fragmentary exploded perspective view showing a third preferred embodiment of the present invention.

FIG. 6 shows an exploded perspective view of a cover mounting portion according to a third preferred embodiment of the present invention. In this preferred embodiment, a pair of support members 48 are fixed to the cover 20 in the vicinity of the mounting portions of the shafts 30, respectively. Each shaft 30 is held between the corresponding side plate 26 and the corresponding support member 48, and is fixed at its both ends by means of two screws 32 and 32'. By supporting both ends of each shaft 30 in this manner, the mounting strength of each shaft 30 can be improved. In the case where the cover 20 is formed of resin, the support members 48 and the cover 20 may be integrally formed by molding. In this case, the inside surface of the cover 20 must be treated to have electrical conductivity, so as to ensure an electromagnetic shielding property.

Figure 7:
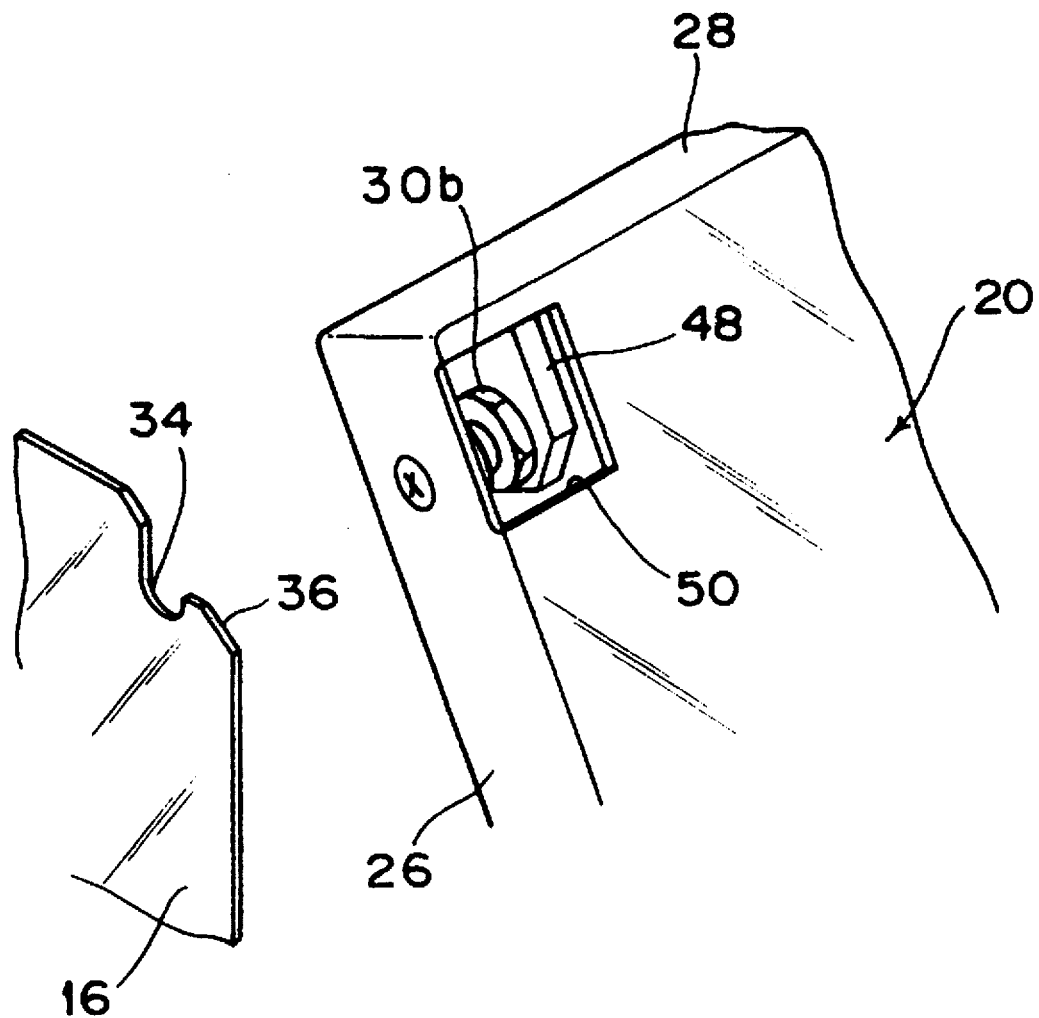
FIG. 7 is a fragmentary perspective view showing a fourth preferred embodiment of the present invention.

FIG. 7 shows a perspective view of a fourth preferred embodiment of the present invention. In this preferred embodiment, a pair of openings 50 are formed through the cover 20 at its portions corresponding to the shafts 30. With this structure, the engaged condition of each shaft 30 and the corresponding recess 34 of each side plate 16 can be easily viewed.

Figure 8:
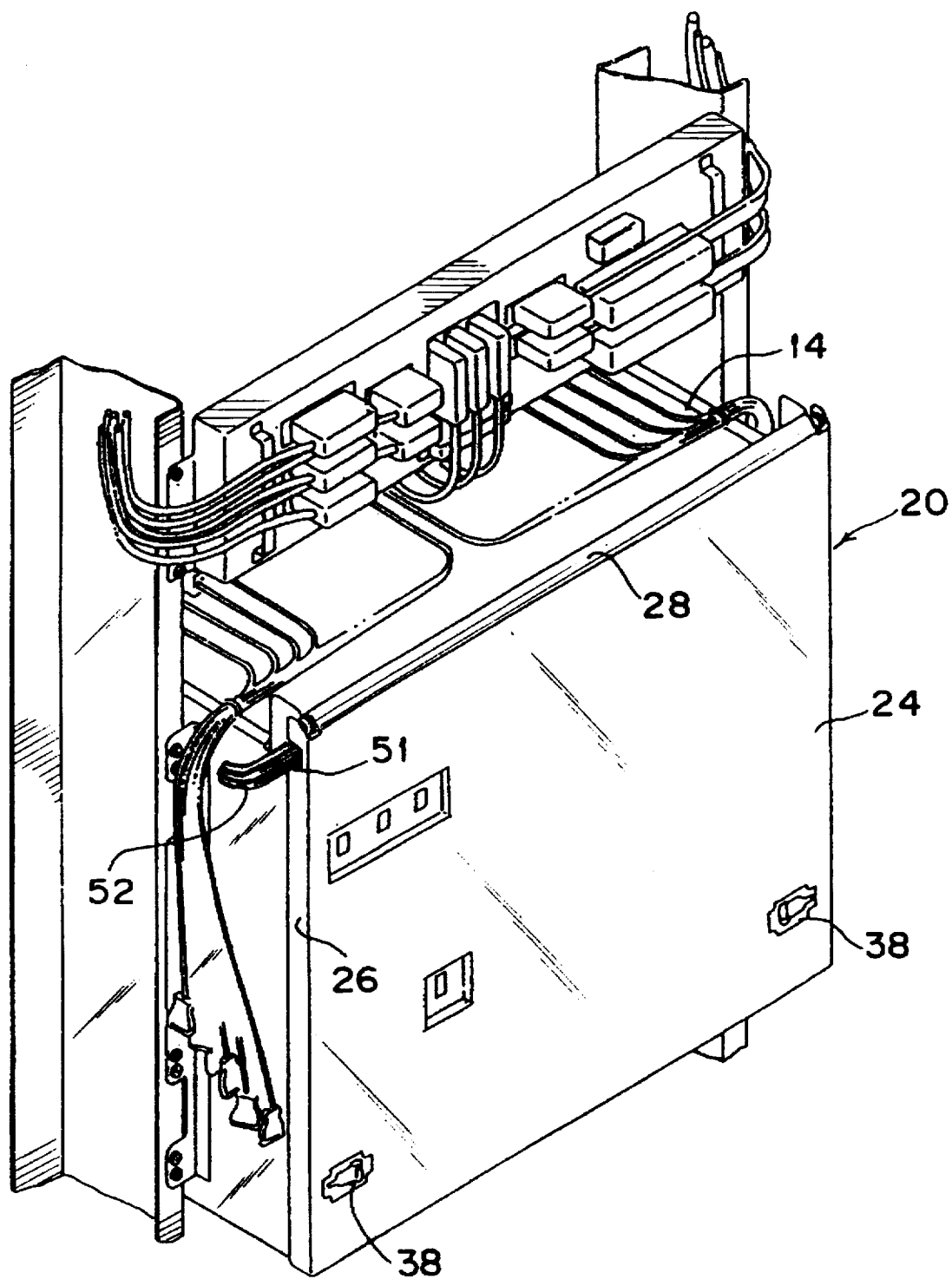
FIG. 8 is a perspective view showing a fifth preferred embodiment of the present invention.

FIG. 8 shows a perspective view of a fifth preferred embodiment of the present invention. In this preferred embodiment, the cover 20 has a top plate 28 bent from the front plate 24 at an obtuse angle thereto. Further, one of the side plates 26 of the cover 20 is formed at its upper end portion with a recess 51 for receiving a bundle of optical cables 52. One of the side plates 16 of the shelf 14 is also formed with a recess 53 (see FIG. 10) for allowing pass of the bundle of the optical cables 51, at a position corresponding to the recess 51 of the cover 20. Owing to the structure that the top plate 28 of the cover 20 is obtusely inclined with respect to the front plate 24, the following advantage can be obtained.

Figure 9A:
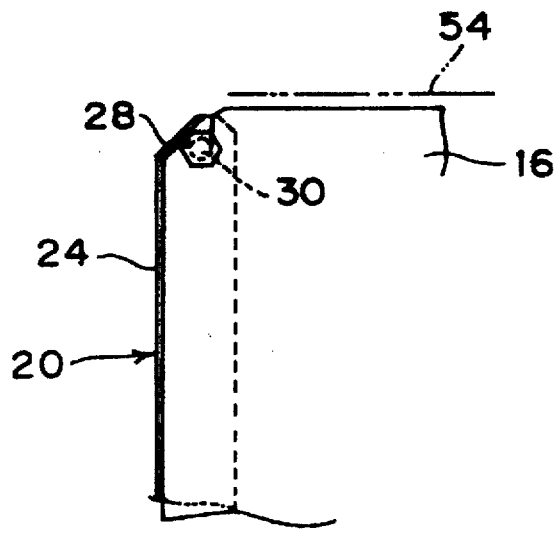
FIGS. 9A, 9B, and 9C are side views illustrating the operation of the fifth preferred embodiment.
Figures 9B, 9C:
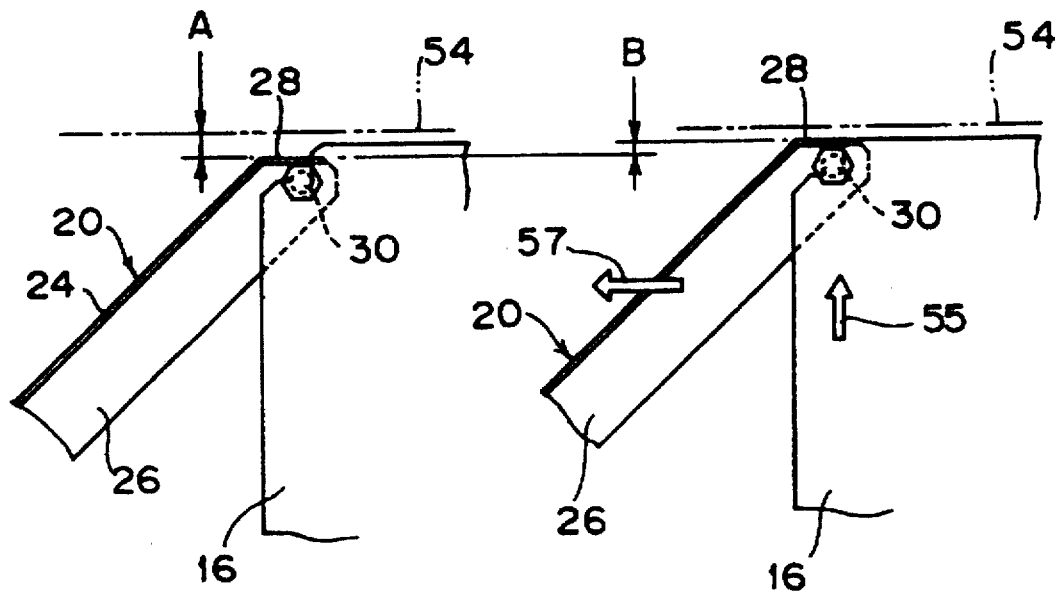

FIG. 9A shows a closed condition of the cover 20. When the cover 20 is pivoted at a given angle about the axes of the shafts 30 as shown in FIG. 9B, the distance A between the top plate 28 of the cover 20 and a rack 54 on which another shelf assembly is mounted is larger than the amount B of vertical movement of the cover 20 required for removal of the cover 20 as shown in FIG. 9C. Referring to FIG. 9C, the cover 20 is removed from the shelf 14 by first lifting the cover 20 by the distance B as shown by an arrow 55 and next pulling the cover 20 horizontally as shown by an arrow 57. Thus, owing to the structure that the top plate 28 of the cover 20 is obtusely inclined with respect to the front plate 24, the mounting and removal of the cover 20 can be easily carried out in a narrow space.

Figure 10:
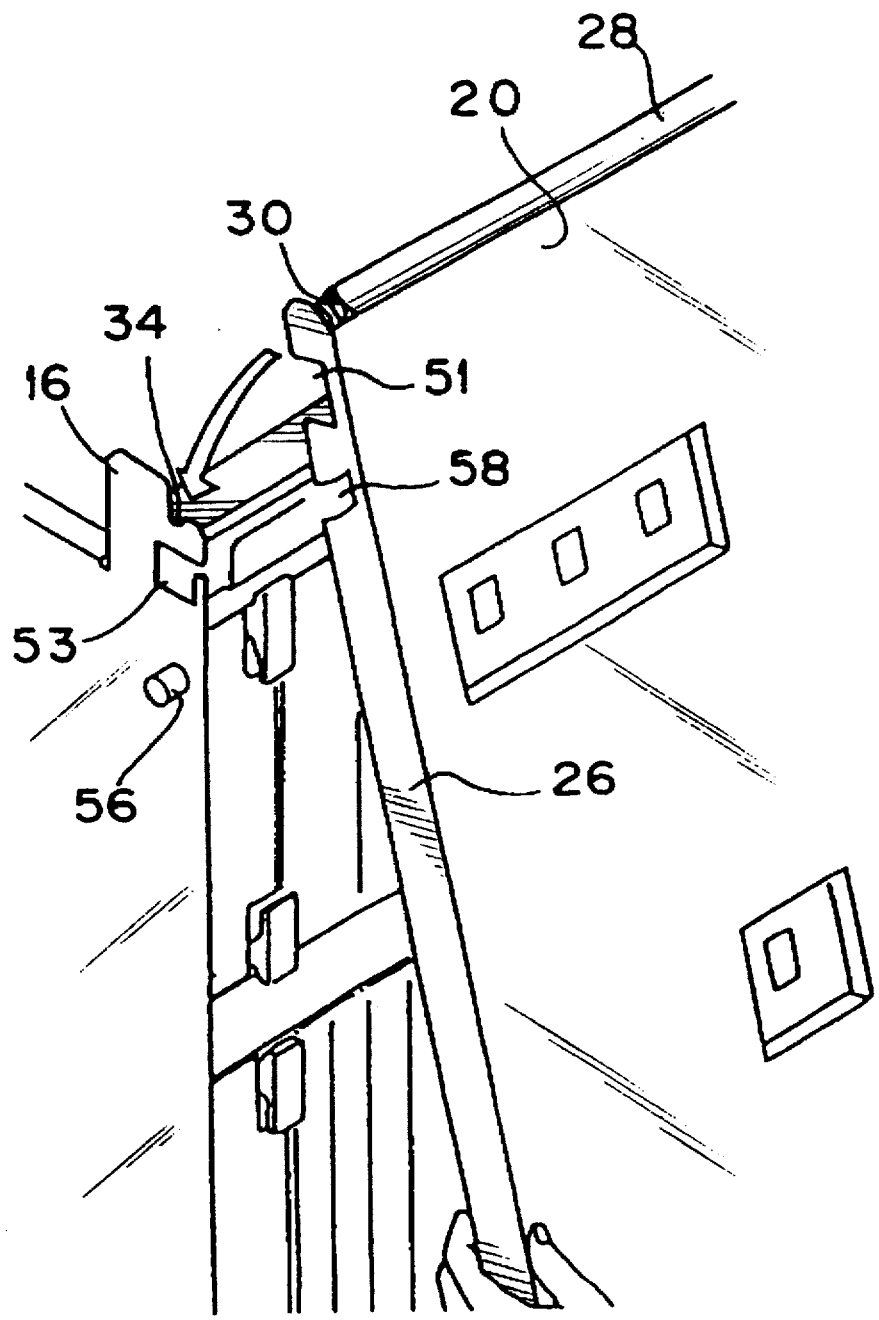
FIG. 10 is a fragmentary perspective view showing a sixth preferred embodiment of the present invention.
Figure 11:
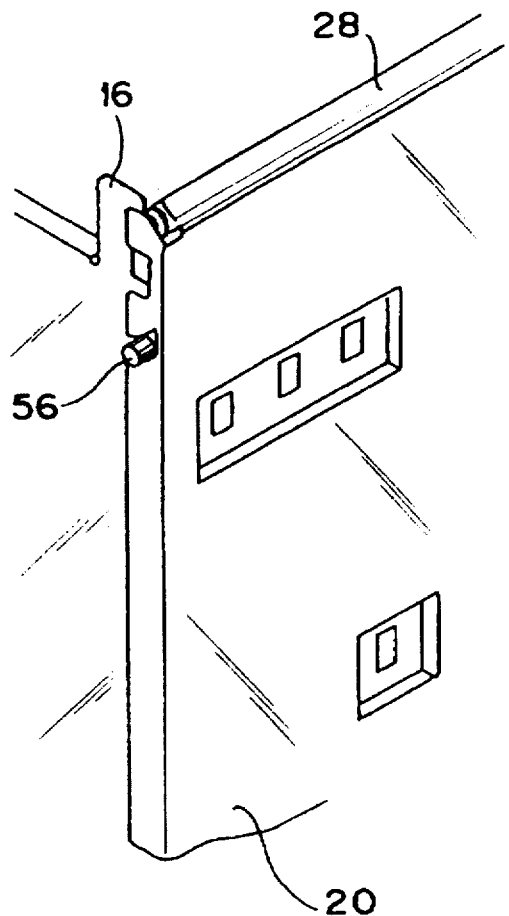
FIG. 11 is a view similar to FIG. 10, illustrating a mounted condition of the cover.

A sixth preferred embodiment of the present invention will be described with reference to FIGS. 10 and 11. In this preferred embodiment, a pin 56 is projected horizontally outward from each side plate 16 of the shelf 14, and a recess 58 adapted to engage the pin 56 is formed in each side plate 26 of the cover 20. When the cover 20 is mounted on each side plate 16 of the shelf 14, the pin 56 of each side plate 16 of the shelf 14 comes into engagement with the corresponding recess 58 of each side plate 26 of the cover 20 as shown in FIG. 11.

Figure 12A:
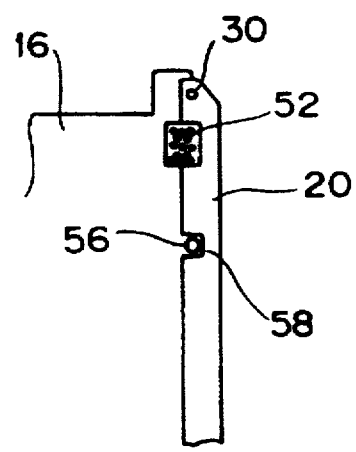
FIGS. 12A and 12B are side views illustrating the operation of the sixth preferred embodiment.
Figure 12B:
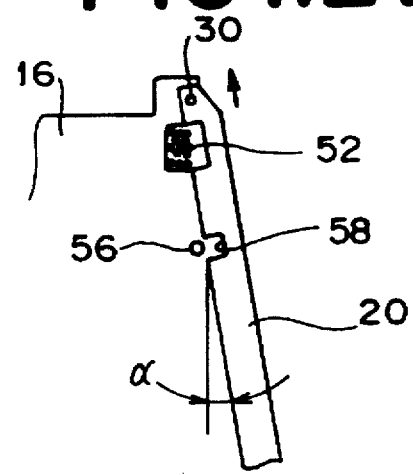

The cover 20 is allowed to be removed from the side plates 16 of the shelf 14 only when the cover 20 in the closed condition as shown in FIG. 12A is pivoted at a given angle α or more about the axes of the shafts 30 as shown in FIG. 12B. Accordingly, in removing the cover 20 from the side plates 16 of the shelf 14, the optical cables 52 are prevented from being caught and damaged by the cover 20.

Figure 13:
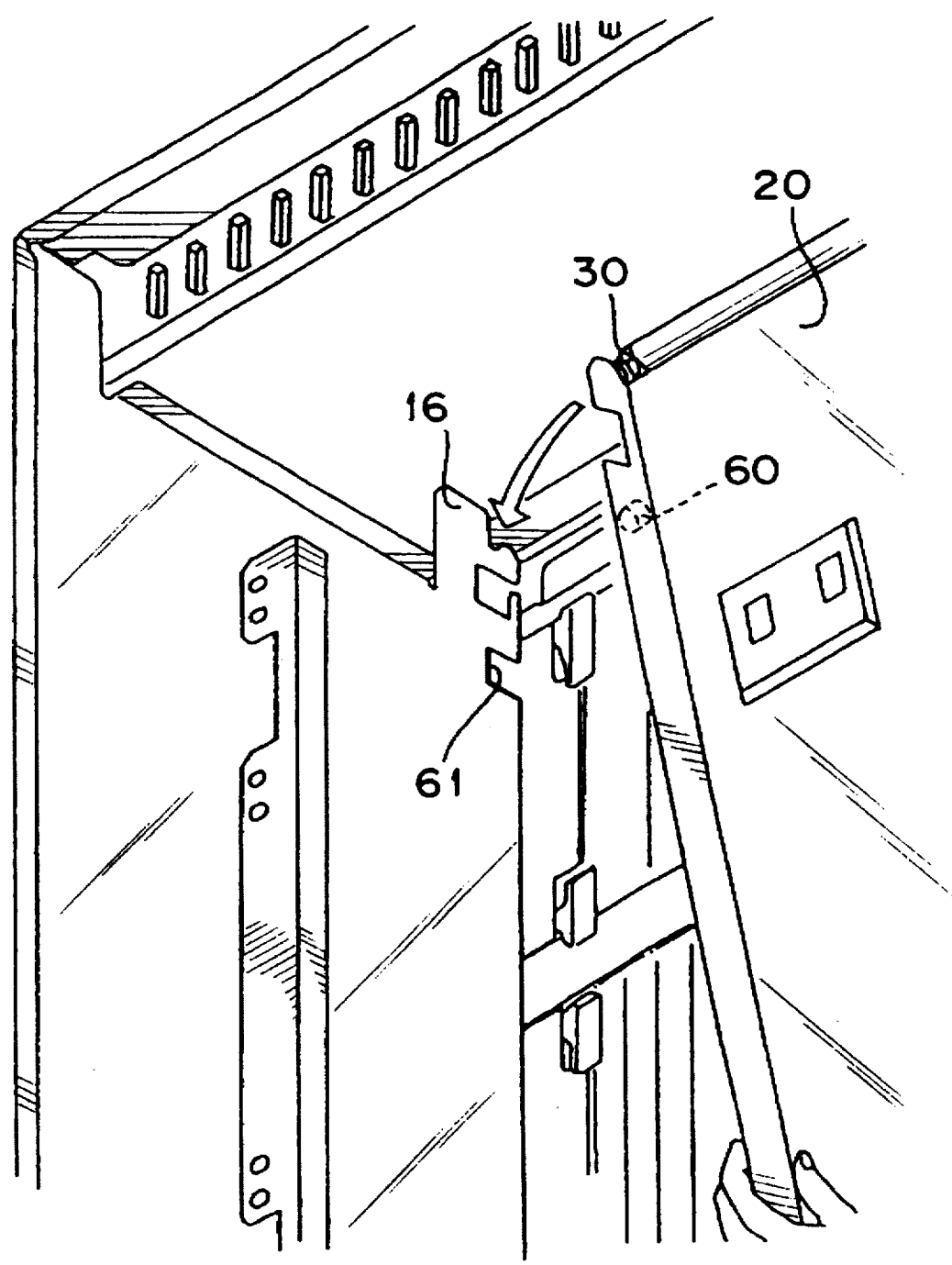
FIG. 13 is a fragmentary perspective view showing a seventh preferred embodiment of the present invention.

Further, in the case where the lock mechanisms 38 are released in the closed condition of the cover 20, it can be prevented that the cover 20 may rise to cause disengagement of the shafts 30 from the recesses 34 of the side plates 16. As a seventh preferred embodiment of the present invention shown in FIG. 13, a pin 60 may be projected horizontally inward from each side plate 26 of the cover 20, and a recess 61 adapted to engage the pin 60 may be formed in each side plate 16 of the shelf 14.

Figure 14:
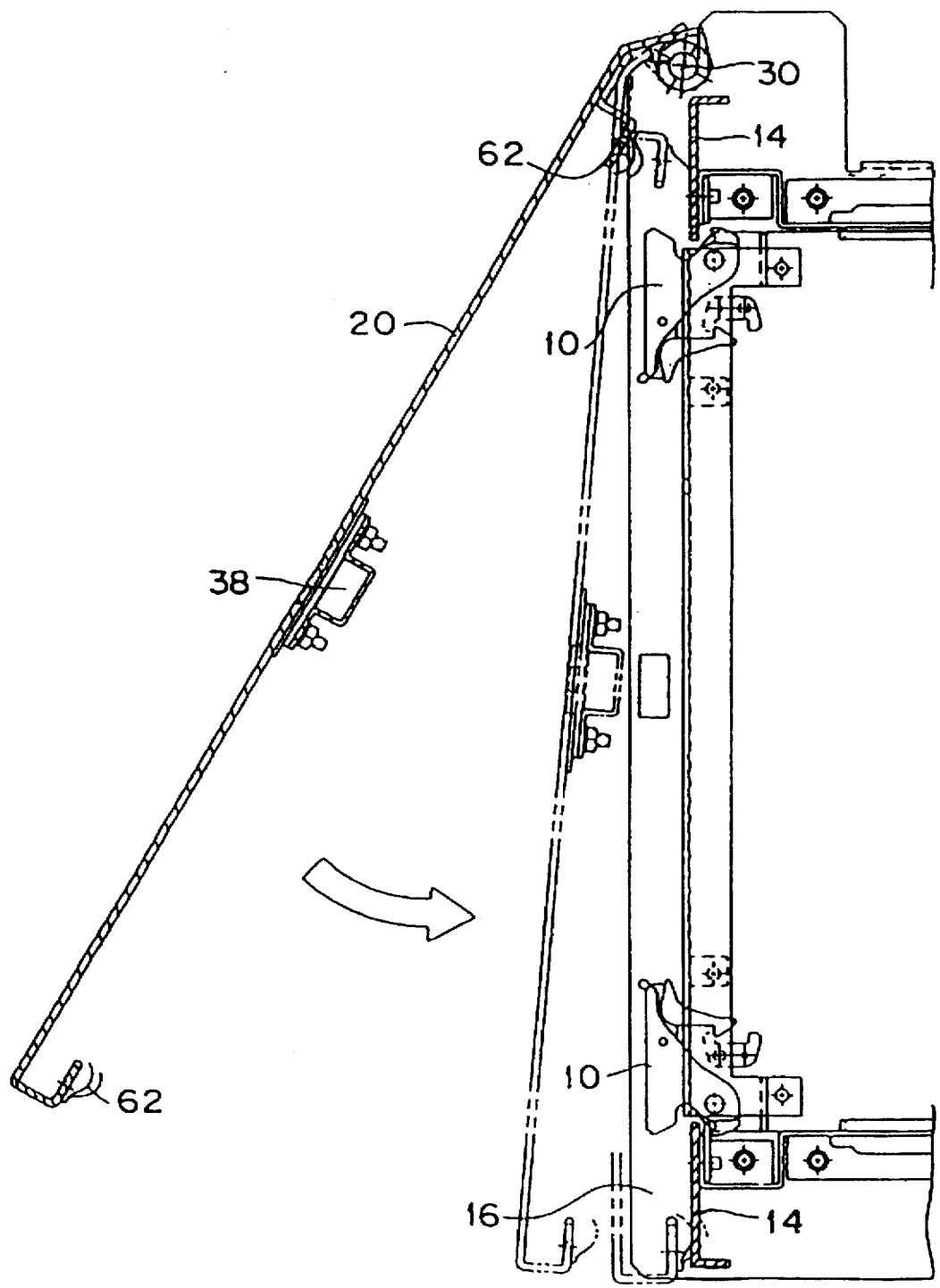
FIG. 14 is a vertical sectional view showing an eighth preferred embodiment of the present invention.
Figure 15:
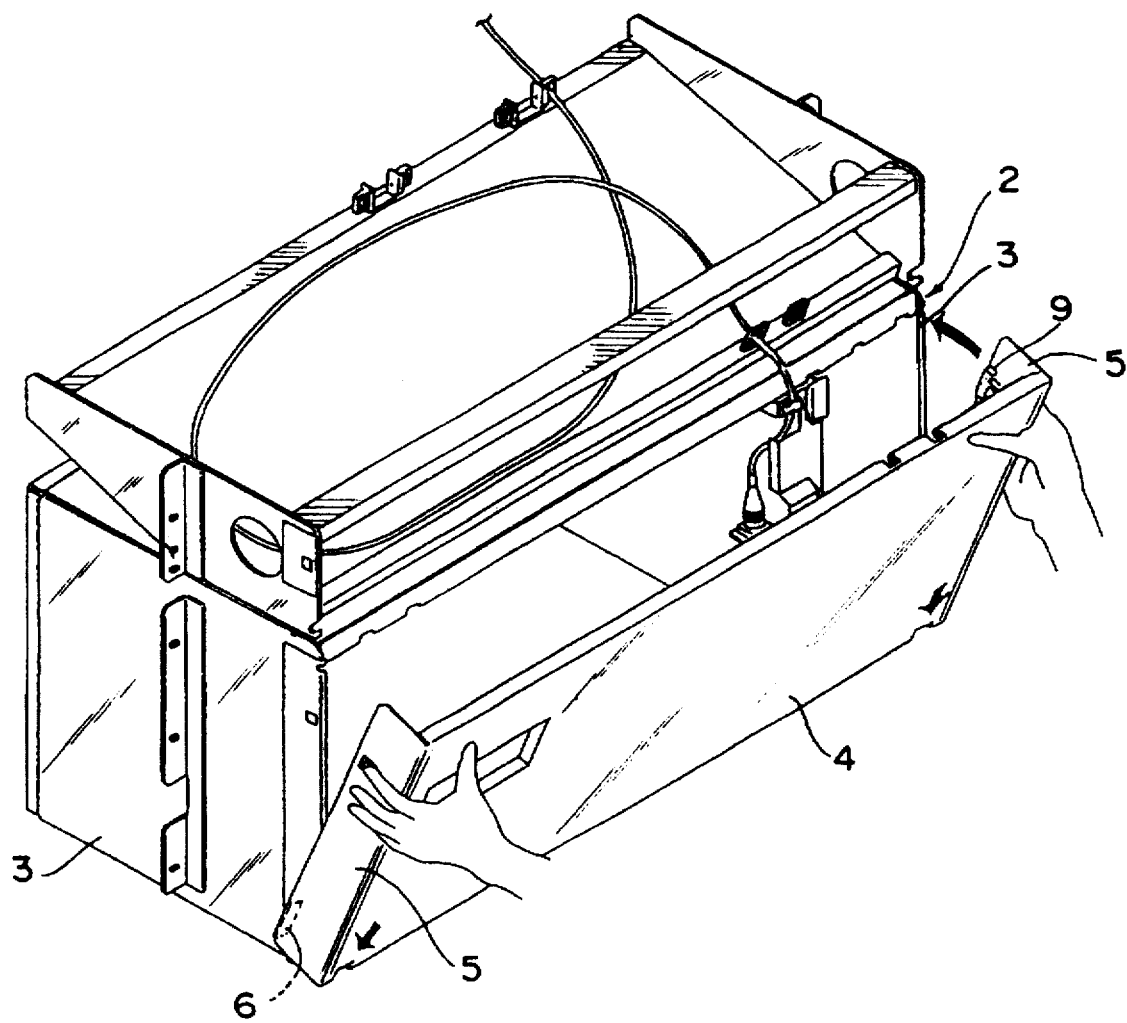
FIG. 15 is a perspective view showing a cover mounting structure in the related art.

FIG. 14 shows a vertical sectional view of an eighth preferred embodiment of the present invention. In this preferred embodiment, a shield spring 62 having a high degree of flexibility for electromagnetically shielding the interior of the shelf 14 is mounted on the inside surface of the cover 20 over the entire periphery thereof. Since the shield spring 62 has a high degree of flexibility, it can follow deformation of the cover 20 and deformation of the shelf 14. The shield spring 62 is mounted on the cover 20 at such a position as not to come into contact with package inserting/removing levers 10. Although neither shown nor described, it is preferred that the shield spring 62 shown in FIG. 14 is also mounted on the cover 20 over the entire periphery thereof in the first to seventh preferred embodiments.

According to the present invention, the cover can be easily mounted on the shelf, and even when the cover is unlocked, falling of the cover can be reliably prevented. Further, since the shield spring having a high degree of flexibility can be used, it is unnecessary to mount a reinforcing member on the cover, thereby realizing a reduction in weight and cost of the cover.

What is claimed is:

1. A cover mounting structure of a shelf assembly comprising:
    a shelf having a pair on side plates and a plurality of electronic circuit packages mounted in said shelf;
    a cover having a front plate, a pair of side plates bent from said front plate at a substantially right angle thereto, and a top plate bent from said front plate at a predetermined angle thereto;
    a pair of shafts fixed in the vicinity of upper ends of said side plates of said cover so as to project inside of said cover;
    a pair of recesses formed at upper ends of said side plates of said shelf, for receiving said shafts;
    a pair of guiding slant surfaces formed at front edges of said upper ends of said side plates of said shelf, for guiding reception of said shafts into said recesses;
    wherein said shafts are engaged with said recesses to thereby mount said cover on said shelf assembly; and
    locking means for removably locking said cover to said side plates of said shelf;
    wherein said cover is divided into at least a first segment and a second segment along a horizontal division line, and said first and second segments are connected by connecting means so as to be bendable inwardly.

2. A cover mounting structure according to claim 1, wherein said predetermined angle is an obtuse angle.

3. A cover mounting structure according to claim 2, wherein each of said shafts has a pair of heads, each having an opposing inside wall, defining an annular groove therebetween, and said annular groove has a width larger than a thickness of each of said side plates of said shelf.

4. A cover mounting structure according to claim 3, wherein each said opposing inside wall of each of said heads defining said annular groove is partially formed with a slant surface.

5. A cover mounting structure according to claim 3, wherein said cover has a pair of support members integrally fixed to said cover, and each of said shafts is fixedly supported by each of said side plates of said cover at a first end of each of said shafts and by each of said support members at an end opposite said first end of each of said shafts.

6. A cover mounting structure according to claim 5, wherein said cover has a pair of openings at positions respectively corresponding to said shafts.

7. A cover mounting structure according to claim 5, wherein each of said side plates of said shelf has a projection horizontally projecting therefrom, and each of said side plates of said cover has a recess adapted to engage a respective said projection.

8. A cover mounting structure according to claim 5, wherein each of said side plates of said cover has a projection horizontally projecting therefrom, and each of said side plates of said shelf has a recess adapted to engage a respective said projection.

9. A cover mounting structure according to claim 5, wherein said cover has a spring mounted over the entire periphery of said cover, and said spring is adapted to be flexed in a pivotal direction of said cover and come into pressure contact with said shelf when said cover is fixed to said shelf.

* * * * *